United States Patent [19]
Udo et al.

[11] Patent Number: 4,628,590
[45] Date of Patent: Dec. 16, 1986

[54] METHOD OF MANUFACTURE OF A SEMICONDUCTOR DEVICE

[75] Inventors: Shinji Udo, Tachikawa; Masanori Tazunoki, Kodaira, both of Japan

[73] Assignees: Hitachi, Ltd.; Hitachi Microcomputer Engineering, Ltd., both of Tokyo, Japan

[21] Appl. No.: 650,172

[22] Filed: Sep. 13, 1984

[30] Foreign Application Priority Data

Sep. 21, 1983 [JP] Japan ................. 58-172990

[51] Int. Cl.[4] .................................. H01L 21/66
[52] U.S. Cl. ............................... 29/575; 29/574; 29/571; 29/576 C; 148/DIG. 55; 357/51
[58] Field of Search ............. 148/DIG. 55; 29/575, 29/576 C, 574, 571; 357/40, 45, 54, 65, 68, 71, 51; 427/93

[56] References Cited

U.S. PATENT DOCUMENTS

| 3,585,712 | 12/1968 | Boncuk | 29/574 |
| 3,702,025 | 11/1972 | Archer | 29/574 |
| 3,792,319 | 2/1974 | Tsong | 148/DIG. 55 |
| 4,413,272 | 11/1983 | Mochiyuki et al. | 357/65 |

FOREIGN PATENT DOCUMENTS

| 143839 | 9/1982 | Japan | 29/574 |
| 23530 | 2/1984 | Japan | 29/574 |

OTHER PUBLICATIONS

Murarka, "Refractory Silicides for Integrated Circuits" J. Vac. Sci. Tech. 17, (4), Jul./Aug. 1980.

Primary Examiner—Brian E. Hearn
Assistant Examiner—John T. Callahan
Attorney, Agent, or Firm—Antonelli, Terry & Wands

[57] ABSTRACT

This invention discloses a semiconductor device, and method of manufacturing such device, which provides a high degree of moistureproofing, provides a high production yield, and in which defective elements can be replaced by the use of fuses. A circuit test of the device is conducted while at least part of each of a fuse and a bonding pad is exposed through a first passivation film covering a semiconductor substrate on which circuit elements such as MISFETs and capacitors are formed, and any defective elements are replaced by the use of fuses. Contamination of and damage to the elements during the test can thus be prevented. Thereafter, a second passivation film is formed so as to cover all the essential portions of the fuses and bonding pads. The exposure of cracks in the fuses and bonding pads is thus prevented, and the invasion of moisture, etc., into the lower layers below the fuses and bonding pads is also prevented, thereby improving the moistureproofing and reliability of the device.

48 Claims, 15 Drawing Figures

METHOD OF MANUFACTURE OF A SEMICONDUCTOR DEVICE

BACKGROUND OF THE INVENTION

This invention relates generally to a semiconductor device, and a method of manufacture thereof. More specifically, the present invention relates to a manufacturing method which is suitable for producing a semiconductor device which has redundant circuits for replacing defective elements, and to a semiconductor device provided by this method.

In semiconductor devices, a circuit test is performed on each semiconductor chip acting as a single semiconductor device, during the wafer state in which semiconductor elements are formed on a semiconductor substrate, that is, before packaging the chips. In this test, the probe of a prober is brought into contact with each bonding pad of the semiconductor chip which will form one semiconductor device. Predetermined signals are applied to the semiconductor chip through the probe so that the semiconductor chip is activated, and its performance can be tested.

However, the inventors of this invention have found that the following problems arise. During the test, the probe must be pressed firmly onto the bonding pads in order to ensure reliable contact, and the bonding pads are apt to be damaged by the contact with the tip of the probe. Since the bonding pads are made of thin aluminum film, this damage is likely to result in cracks extending through the entire thickness of the bonding pads, and an inter-layer insulating film below the bonding pads, made of a substance such as PSG (phosphosilicate glass), is partially exposed as a consequence. It is also likely that moisture penetrating the completed semiconductor device could reach the inter-layer insulating film through such cracks, and eventually reduce the insulation or corrode the bonding pads through the cracks. The reliability of the semiconductor device would be lost thereby.

In a semiconductor device such as a semiconductor memory device provided with redundant circuits for replacing defective bits, defective bits are replaced by the redundant circuits by cutting fuses on the basis of the test results, and these are removed from the circuit.

As a result of studies, the inventors have found that in order to reliably cut these fuses, a window is preferably formed on the insulating film over each fuse so that the fuse is exposed at that portion. For this purpose, windows must also be provided in the final passivation film to expose each fuse. This means that the fuses of the completed semiconductor device are always exposed, irrespective of whether or not they have been cut, and moisture penetrating into the exposed portions would short-circuit the fuses and reduce the reliability of the semiconductor device.

SUMMARY OF THE INVENTION

It is, therefore, an object of the present invention to provide a method of producing a semiconductor device in which moistureproofing of at least the fuses and, in particular, the bonding pads and fuses, of the semiconductor device is improved, corrosion and damage at these portions can be prevented, and thus the reliability of the semiconductor device can be improved.

It is another object of the present invention to provide a semiconductor device in which the moistureproofing of at least the fuses thereof and, in particular, the bonding pads and fuses thereof, is improved, so that corrosion of the pads and damage to the fuses can be prevented.

These and other objects and novel features of the present invention will become more apparent from the following description and accompanying drawings.

The above-described objects are achieved by forming a first passivation film covering a semiconductor substrate having circuit elements and fuses, with associated bonding pads, formed thereon; with the first passivation film having openings exposing at least portions of the fuses and, in particular, at least portions of the fuses and bonding pads. After any necessary changing of the electrical resistance of certain of the fuses (e.g., increasing the electrical resistance thereof, such as by cutting the fuses), a second passivation film is formed over at least the exposed portions of the fuses and, in particular, over the exposed portions of the fuses and part of the exposed portion of the bonding pads.

Among the inventions disclosed herein, the following is a typical example. A circuit test is done while a first passivation film covering a semiconductor substrate, on which circuit elements such as MISFETs, capacitors and the like are formed, is partially open over the fuses and bonding pads thereof. The fuses are then cut if necessary. A second passivation film is then formed so as to cover the essential portions of the fuses and bonding pads. Any cracks in the fuses and bonding pads are thus covered by the passivation film to prevent their exposure. In this manner, invasion of moisture or the like below the fuses and the bonding pads can be prevented, and moistureproofing as well as the reliability of the semiconductor device can be improved.

DESCRIPTION OF THE PREFERRED EMBODIMENTS

FIGS. 1A through 1I, 2A and 2B and 3 illustrate step-by-step the method of manufacturing a semiconductor device in accordance with the present invention. In this example, the production of a dynamic random access memory (DRAM) provided with MISFETs and capacitors as circuit elements is illustrated. The method of the present invention will now be described with reference to FIGS. 1A through 1I.

Figure 1A:
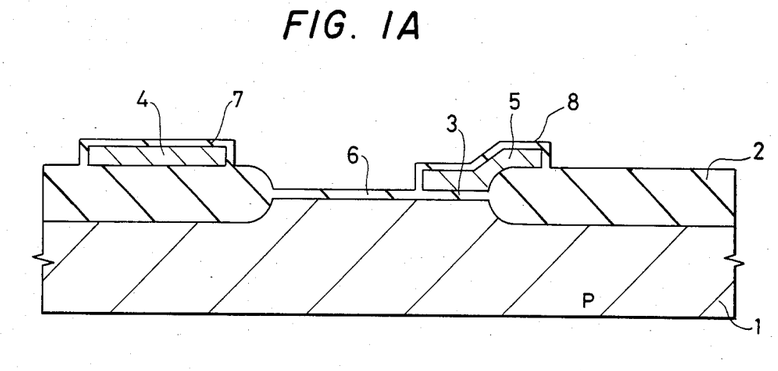
FIGS. 1A through 1I are sections illustrating the step-by-step manufacturing method of the present invention.

A field-insulating film ($SiO_2$ film) 2 is first formed on a main surface of a p-type monocrystalline silicon substrate (hereinafter called "substrate" for short) 1 by selective thermal oxidation of the surface using a silicon nitride ($Si_3N_4$) film as a mask. A first gate-insulating film 3 is then formed within an active region defined by the field insulating film 2. This first gate-insulating film 3 is either an $SiO_2$ film formed by thermal oxidation or a film with a three-layered structure consisting of the SiO$_2$ film, an Si$_3$N$_4$ film formed on the SiO$_2$ film by CVD (chemical vapor deposition) and a SiO$_2$ film over the Si$_3$N$_4$ film.

A first conductor layer consisting of 4000 Å-thick polysilicon is deposited over the entire surface of the substrate 1, and is etched to a predetermined pattern. Such deposition and etching can be performed by procedures known in the art. In this manner, fuses 4 connected to redundant circuits, not shown, are formed on the field-insulating film 2, while capacitor electrodes 5 are formed over both the first gate-insulating film 3 and the field-insulating film 2. N-type impurities such as phosphorus are doped into each fuse 4 and capacitor electrode 5 to form a capacitor (e.g., MIS capacitor) which is one of the circuit elements. After the films and the element are thus formed, the first gate-insulating film 3 exposed on the surface of the substrate 1 is removed, and the surface of the substrate 1 thus re-exposed is thermally oxidized to form a second gate-insulating film (SiO$_2$) 6, and at the same time, the surface of the polysilicon forming each fuse 4 and capacitor electrode 5 is thermally oxidized to form 3000 Å-thick SiO$_2$ films 7 and 8, respectively, that are thicker than the second gate-insulating film 6. The fuses 4 as well as the capacitor electrodes 5 are now 2500 Å-thick.

Figure 1B:
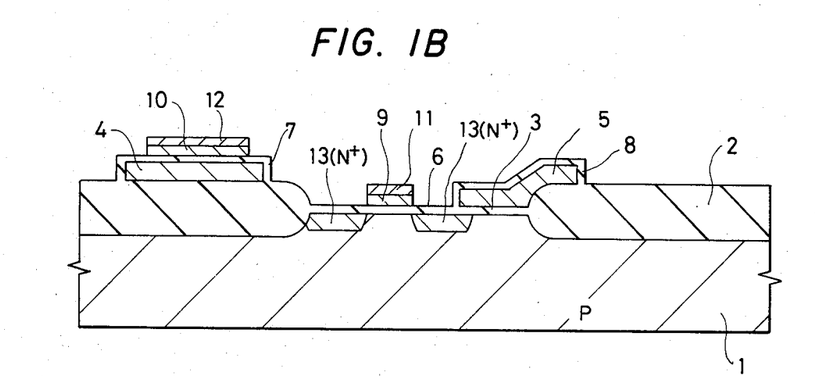

Next, as shown in FIG. 1B, a second conductor layer consisting of a 2500 Å-thick polysilicon film covered with a 3000 Å-thick film of a silicide of a metal with a high melting point, such as Mo, is deposited over the entire surface, and is then etched to a predetermined pattern. Conventional deposition procedures can be used to form the polysilicon film and film of a silicide of a metal with a high melting point; moreover, the polysilicon film can be etched by, e.g., wet etching techniques and the silicide etched by, e.g., dry etching. In this manner, gate electrodes consisting of a second polysilicon layer 9 and a molybdenum silicide layer 11 are formed over the second gate-insulating film 6. The second conductor layer, that is, the second polysilicon layer 10 and the molybdenum silicide layer 12, are formed over the fuses 4, particularly over a portion of each thereof which has a narrow width designed to be cut (a portion 4a, see FIG. 3). In this state, ions of an N-type impurity such as As are implanted into the main surface of the substrate 1, forming an N$^+$-type source or drain region 13 on each side of the gate electrode in a self-alignment arrangement. The MISFETs acting as circuit elements are thus completed.

Figure 1C:
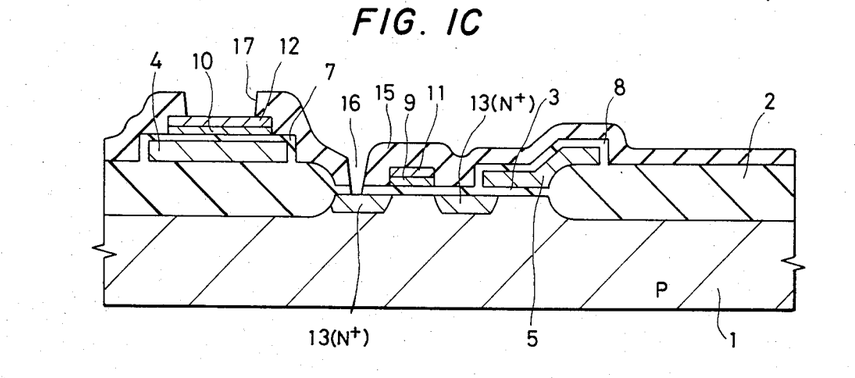

Next, as shown in FIG. 1C, a phosphosilicate glass (PSG) film 15 acting as an inter-layer insulating film is deposited, by known deposition techniques, over the entire surface of the substrate 1, and a contact hole 16 for each source or drain region 13 is then formed therein. At the same time, the PSG film 15 over each of the fuses 4, particularly the substantially central portion (portion 4a) of each fuse 4 which has a narrow width for cutting, is etched so that an opening 17 is defined thereby. During the etching of the PSG film 15, e.g., by known wet etching techniques the SiO$_2$ film 7 and the fuses 4 are not damaged because they are protected by the molybdenum silicide layer 12 and the second polysilicon layer 10. As can be appreciated, a wet etching technique which etches the PSG at a much faster rate than it etches the silicide layer 12, so that the lower layer is not etched during etching of the upper layer, is used.

Figure 1D:
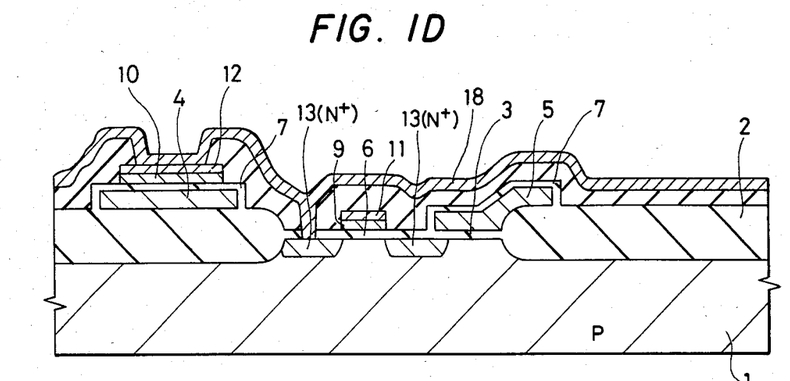

A third conductor layer 18 made of a metal such as Al is then deposited over the entire surface, as shown in FIG. 1D.

Figure 1E:
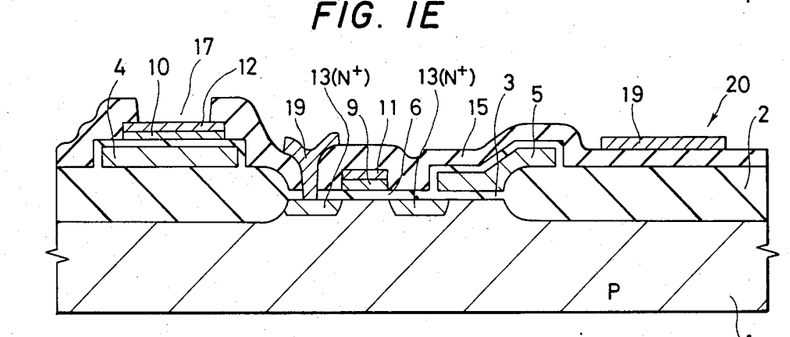
Figure 2A:
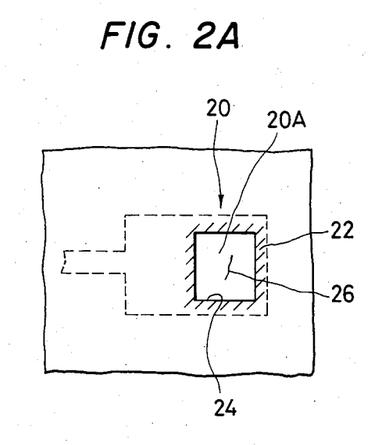
FIGS. 2A and 2B are plan views illustrating the steps of manufacturing the bonding pads.
Figure 2B:
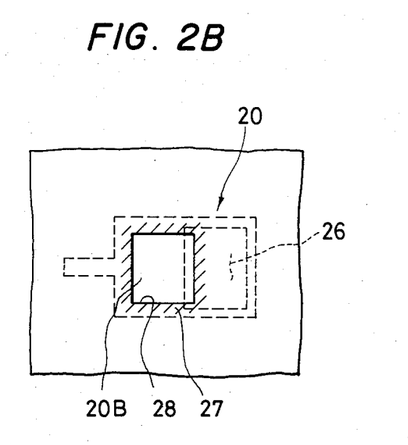

The third conductor layer 18 is selectively dry etched using CCl$_4$ gas, to provide a wiring film 19 of a predetermined pattern, as shown in FIG. 1E. This Al wiring film 19 is connected to each source or drain region 13 through the corresponding contact hole 16, and bonding pads 20 of a size of about 1.5 times the standard size, such as 150 µm by 100 µm for example, are formed on the field-insulating film 2, as shown in FIGS. 2A and 2B. The Al film 18 within the opening 17 over each fuse 4 is removed. During the removal of the Al film 18 by dry etching, no unwanted cutting of the fuses 4 occurs because they are covered with the molybdenum silicide layer 12 and the second polysilicon layer 10.

Figure 1F:
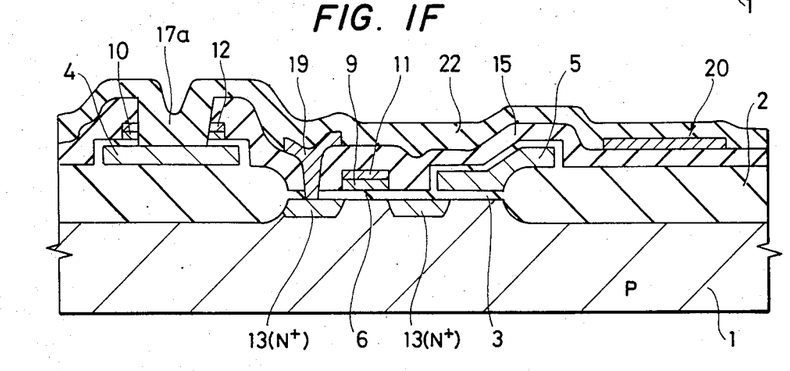

Next, the molybdenum silicide film 12 and the second polysilicon film 10 are etched (e.g., the silicide film being etched by a dry etching technique and the polysilicon film 10 by wet etching) through the opening 17 over each fuse 4, as shown in FIG. 1F, and the SiO$_2$ film 7 is further etched, e.g., by wet etching, to form an opening 17a. Thereafter, a relatively thin, first final passivation film 22 consisting of a 2000 Å-thick PSG film is deposited by CVD over the entire surface.

Figure 1G:
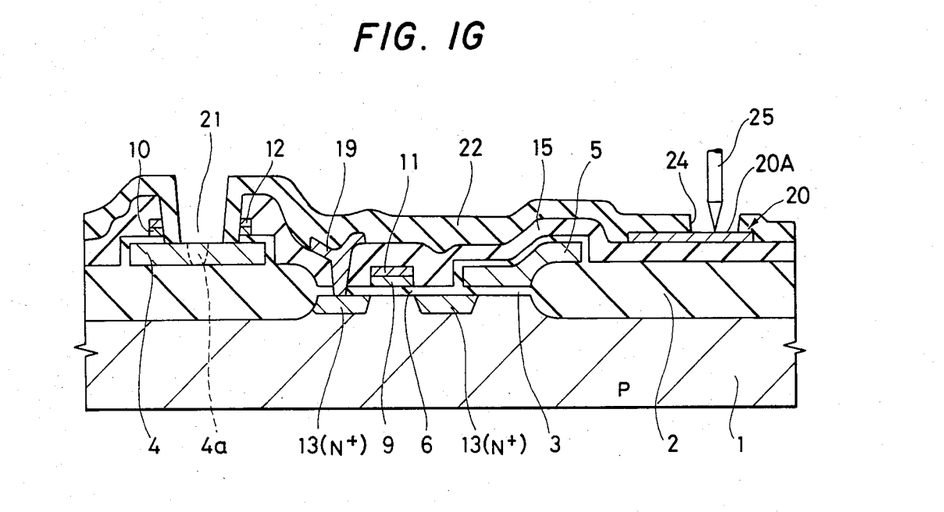
Figure 3:
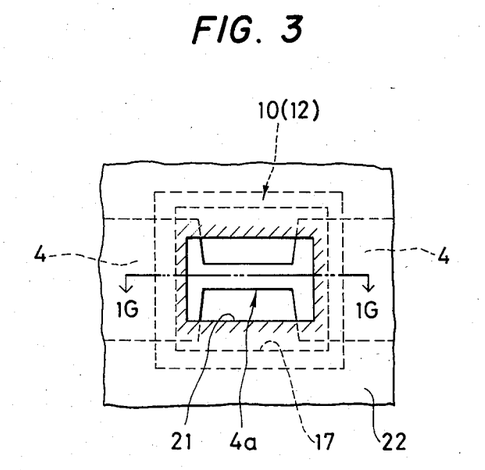
FIG. 3 is a plan view illustrating how a window over a fuse is opened.

As shown in FIG. 1G, the first final passivation film 22 over each fuse 4 is etched, e.g., by wet etching, to form an opening 21, completely exposing the central portion 4a of the fuse 4. FIG. 3 is a plan view of a fuse 4 and its opening 17, 21. A section along the line 1G—1G of FIG. 3 is shown on the left-hand side of FIG. 1G. Although not shown in these drawings, both ends of each fuse 4 are connected to the aluminum wiring. At the same time, part of the first final passivation film 22 over each bonding pad 20 is etched to form an opening 24, shown also in FIG. 2A. Thus, the bonding pads are partly exposed. These steps complete the DRAM.

A test using a prober is done at this stage. In other words, a probe 25 of the prober is brought into contact with the exposed portion 20A of each bonding pad 20 to establish connection between the testing apparatus and the internal circuit of the dynamic memory. Predetermined D.C. voltage and signal are applied to the internal circuit to test its operation. An excessive current is made to flow through a fuse 4 selected on the basis of the results of this test, in order to cut the fuse at the narrow central portion 4a. This is represented by the broken line in FIG. 1G. In this manner, defective bits are replaced by redundant circuits. Since the portion thereof which is to be cut is exposed, the fuse 4 can be reliably cut by a low current.

As the probe test is done after the formation of the first passivation film 22, the following advantages can be obtained. First, it is possible to prevent the tip of the probe 25 coming into contact with portions other than the pads 20, and eventually prevent the semiconductor chip from becoming defective. Since the tip of the probe 25 is positioned within the recess produced by each opening 24, it is difficult for it to move in the transverse direction. Even if the probe 25 comes into contact with portions other than the exposed portions 20A of the bonding pads 20, any scratches or cracks produced thereby are only in the first passivation film 22, but the circuit elements are not damaged. Moreover, contamination of the semiconductor substrate on which the circuit elements are formed can be prevented. The cleanness of the environment in which the probe is placed need not be very high, but dust in the atmosphere should be prevented from directly attaching to the circuit elements and the aluminum wiring to make the semiconductor chip defective. On the other hand, the cleanness of the environment need not be as high as that required for diffusion and CVD when the probe test is carried out before the formation of the second passivation film corresponding to the conventional final passivation film.

The fuses 4 are cut after the formation of the first passivation film 22, so that it is possible to prevent spatter from the cut fuses 4 attaching to the circuit elements and the aluminum wiring.

The first passivation film 22 improves the production yield.

After the above test has been completed, the fuses 4 are still exposed, whether or not they have been cut. Scratches and cracks will develop over the surfaces or throughout the entire thickness of the bonding pads 20A as a result of their contacts with the probe 25.

Figure 1H:
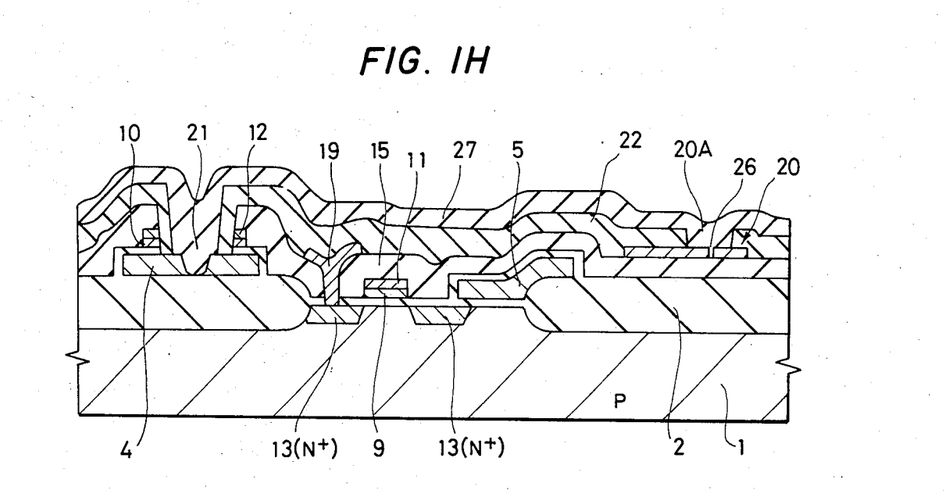

Accordingly, a 15,000 Å-thick silicon oxide film or silicon nitride film acting as a second final passivation film 27 is deposited over the entire surface of the substrate 1 by plasma CVD, as shown in FIG. 1H, and the exposed fuses 4 and bonding pads 20 are thus covered.

Figure 1I:
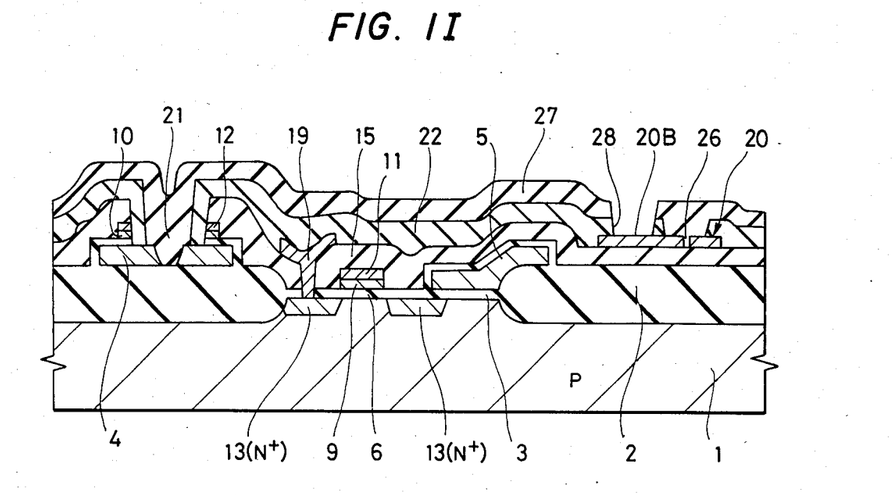

Next, as shown in FIG. 1I, the second final passivation film 27 and the first final passivation film 22 are etched in the proximity of the opening 24 on each bonding pad 20, and are removed so that a new opening 28 is formed. Such etching in the proximity of the opening 24 on each bonding pad 20 can be performed, e.g., by forming a resist mark on the second final passivation film and using such mark to form the opening 28 using, e.g., one or two etch steps. As also shown in FIG. 2B, a portion of each bonding pad 20B which is different from the portions where there could be any scratches or cracks is exposed. Any cracks 26 are covered with the SiO$_2$ or silicon nitride film acting as the second final passivation film 27 to form a new bonding pad without any cracks. The DRAMs thus completed are diced into separate semiconductor chips, bonding wires are connected to the crack-free bonding pads, and thereafter the chips are packaged.

In the semiconductor device described above, since the fuses 4 as well as the bonding pads 20A are exposed, any necessary testing and cutting of the fuses can be carried out smoothly during the test. In the finally-completed device, the cracks 26 in the bonding pads 20A and the fuses 4, etc., are covered by the second final passivation film 27, so that no moisture can penetrate the fuses 4 and the cracks 26, and leakage of current, corrosion, damage, etc., resulting from such moisture can be reliably prevented. As a result, the moisture-proofing of the device, and hence its reliability, can be improved. Each opening 28 is formed by etching the second final passivation film 27 at a portion where there are no cracks 26, so that the etching liquid, such as hydrofluoric acid or hot phosphoric acid, does not reach the lower PSG film 15 through the cracks 26 and damage it. The PSG film 15 is not damaged even if the openings 28 are formed by dry etching using CF$_4$ gas or the like.

Figure 4A:
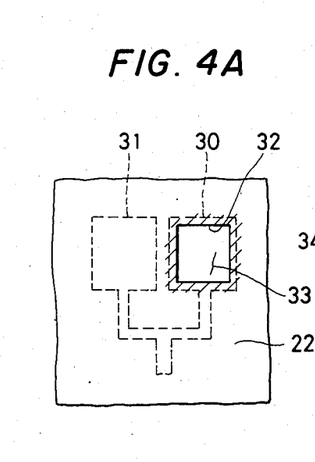
FIGS. 4A and 4B are plan views illustrating the steps of manufacturing a modified example of the bonding pads.
Figure 4B:
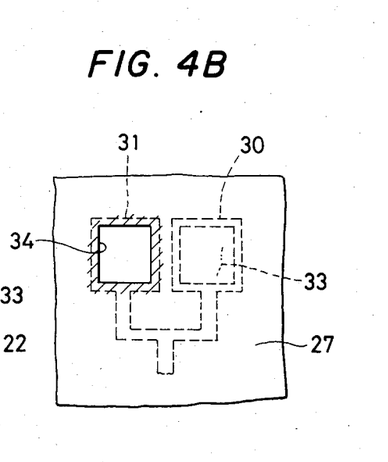

The bonding pads may be formed as shown in FIGS. 4A and 4B. A pair of bonding pads 30, 31 of the same size, e.g., 100 μm by 100 μm, are connected to each other to form one group. The first passivation film 22 over one 30 of the pads is removed to form an opening 32, and the probe is brought into contact with the bonding pad through this opening 32 when the test is conducted. The opening 32 is covered with the second final passivation film 27. An opening 34 is formed in the final passivation film over the other 31 of the pads so as to expose the pad 31. With this construction, any cracks 33 occurring on the first of the pads 30 can be covered by the final passivation film 27 and any drop in moisture-proofing due to the cracks can be prevented. This construction is effective when there is sufficient space for the bonding pads.

If there is no particular reliability problem even if cracks 26 or 33 in the bonding pad 20A or 30 are left exposed, only the fuses 4 need be covered with the passivation film 27, the bonding pads can have the same construction as in prior art devices. This construction can also greatly improve the moistureproofing at the fuse.

Figure 5:
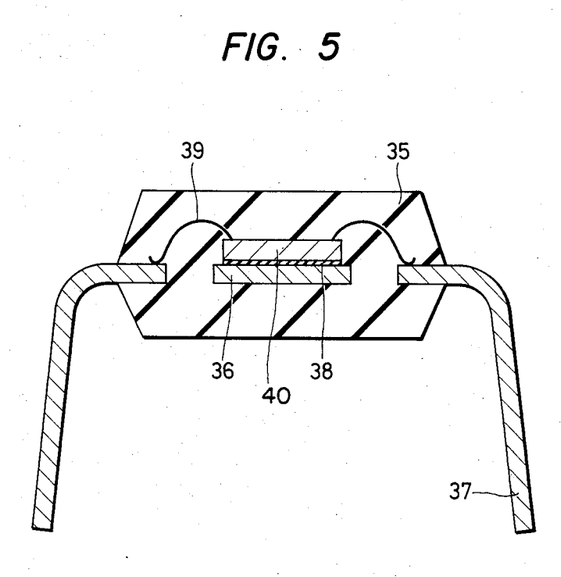
FIG. 5 is a section through the semiconductor device in accordance with one embodiment of the present invention.

Although effective for semiconductor devices of any packaging type, the present invention is particularly effective for a semiconductor device of the resin-molded type (plastic package type), such as that shown in FIG. 5.

In comparison with a hermetically-sealed type of semiconductor device using a ceramic package, it is easier for external moisture to reach the surface of a semiconductor chip 40 in a resin-molded type of semiconductor device. The moisture is transmitted along the boundary between a lead 37 and plastic resin 35 (of, e.g., epoxy), and along a bonding wire 39 or through the bulk of the resin. If cracks 26 or 33 in the bonding pads 20 or 30 are exposed on the surface of the semiconductor chip 40, short circuiting of the fuses and breakage of wires can be caused by corrosion of the aluminum. In the present invention, however, the second passivation film 27 can prevent the occurrence of such problems. The semiconductor chip 40 is bonded onto a tab 36 by an, e.g., conventional bonding material 38 such as gold-silicon eutectic crystals or epoxy resin incorporating silver, as is conventional in the art.

The characteristics of the device are tested while the insulating films over the fuses and bonding pads are open, and thereafter any cracks in the fuses or bonding pads are covered with the second final passivation film. This makes it possible not only to conduct the test and cut the fuses, but also prevent the invasion of moisture into cracks, and eventually improve the reliability of the device as a whole, such as its moistureproofing.

The fuses, whether or not they have been cut, are finally covered with the second final passivation film. Accordingly, the present device can prevent the penetration of moisture more reliably than a conventional semiconductor device, and can improve the moistureproofing of the fuses by preventing current leakage and damage due to such moisture.

Cracks in the bonding pads caused by the contact of the probe during the test are covered by the second final passivation film to prevent the penetration of moisture that would otherwise reach the lower layers through the cracks, and thus prevent leakage and corrosion. In addition, the penetration of the etching liquid is prevented, and hence etching of the lower layers can also be prevented. The reliability of the bonding pads can thus be improved.

Although the present invention has been described with reference to preferred embodiments thereof, it is not particularly limited thereto, and can be practiced in various ways without departing from the spirit and scope thereof.

For instance, the fuses need not necessarily be of a type that is cut electrically, but may be of a type that is cut when a laser beam is shone into the opening 21. The material for the fuses is not particularly limited to polysilicon, either. For example, a material which forms a word line, or a silicide of a metal with a high melting point, such a molybdenum silicide, can also be used. When polysilicon is employed, the fuses may be of a type of which the resistance is greatly reduced by the diffusion of impurities. In the fuses of the shape shown in FIG. 3, for example, the narrow portion 4a at the center of each is not doped, whereas the wider portions on either side thereof are doped with a high concentration of an impurity such as phosphorus. The phosphorus is diffused to non-doped narrow portion 4a and resistance of the portion 4a is lowered by shining a laser beam to heat up the portion 4a.

The shapes of the fuses and bonding pads, and the shapes of each of the openings, can be changed in various ways as appropriate, if necessary. Thus, as an example, each bonding pad can be formed as a single integral member or as bonding pad portions, independently formed, connected by wiring means. The present invention can be applied to all cases in which the connection or separation of a fuse is effected after removing at least part of an insulating film provided over the fuse.

The second conductor layer may be a polysilicon layer, a layer of a metal with a high melting point such as Mo, W, Ti, Ta, etc., or a layer of a metal silicide with a high melting point.

Various materials for the insulating film and various etching methods can also be employed. The materials that have been mentioned in the foregoing are preferable examples of the first and second final passivation films, but it is also possible to use films of other materials, and films formed by other methods. The first final passivation film may have a two-layered structure consisting of a thin $SiO_2$ film with a PSG film over it.

The method of etching and removing the second conductor layer and various insulating films over the fuse, and the shapes thereof, may be changed as appropriate.

In the foregoing description, the present invention has been described primarily with reference to a DRAM which is the field of utilization which led to the invention, but the present invention is not particularly limited to DRAMs and can be applied to all semiconductor devices in which defective elements are replaced by the use of fuses after a test is conducted, such as a static random access memory or other logic circuits.

While we have shown and described various embodiments in accordance with the present invention, it is understood that the same is not limited thereto, but is susceptible of numerous changes and modifications as known to those skilled in the art, and we, therefore, do not wish to be limited to the details shown and described herein, but intend to cover all such changes and modifications as are encompassed by the scope of the appended claims.

What is claimed is:

1. A method of manufacturing a semiconductor device provided with a plurality of fuses formed on a semiconductor substrate, said semiconductor device also including at least one bonding pad over said substrate, comprising the steps of:
   (a) forming a first passivation film over said semiconductor substrate except for at least part of each of said fuses and except for at least part of each of said at least one bonding pad;
   (b) brining a first group of said fuses into a first state and a second group of said fuses different from said first group of said fuses into a second state, the electrical resistance of said fuses in said first state being much greater than that of those in said second state, the difference between said electrical resistances being provided by said part of each of said fuses not covered by said first passivation film; and
   (c) forming a second passivation film over said semiconductor substrate so as to cover at least said part of each of the said fuses not covered by said first passivation film.

2. The method of manufacturing a semiconductor device as defined in claim 1, wherein said first state is established by cutting the portions of said first group of said fuses not covered by said first passivation film.

3. The method of manufacturing a semiconductor device, as defined in claim 1, wherein said fuses are made of polysilicon.

4. The method of manufacturing a semiconductor device as defined in claim 3, wherein the polysilicon of the fuses has been doped with impurities so as to reduce the resistance thereof.

5. The method of manufacturing a semiconductor device as defined in claim 1, wherein said second passivation film leaves exposed a portion of each of said bonding pads.

6. The method of manufacturing a semiconductor device as defined in claim 5, wherein the first passivation film is a two-layered structure of an $SiO_2$ film having a phosphosilicate glass film, formed by chemical vapor deposition, thereover.

7. The method of manufacturing a semiconductor device as defined in claim 1, wherein the first passivation film is a passivation film formed by chemical vapor deposition.

8. The method of manufacturing a semiconductor device as defined in claim 7, wherein the first passivation film is a phosphosilicate glass film formed by chemical vapor deposition.

9. The method of manufacturing a semiconductor device as defined in claim 7, wherein the second passivation film is formed by chemical vapor deposition.

10. The method of manufacturing a semiconductor device as defined in claim 9, wherein the second passivation film is a film of $SiO_2$ or silicon nitride, formed by chemical vapor deposition.

11. The method of manufacturing a semiconductor device as defined in claim 1, wherein the second passivation film is formed by chemical vapor deposition.

12. The method of manufacturing a semiconductor device as defined in claim 1, wherein said fuses comprise a silicide of a metal with a high melting point.

13. A method of manufacturing a semiconductor device comprising the steps of:
   (a) forming a plurlity of fuses and a plurality of elements on a semiconductor substrate;
   (b) forming a plurality of bonding pads and wiring on said semiconductor substrate;
   (c) forming a first passivation film over said semiconductor substrate except for at least part of each of said fuses and except for at least part of each of the bonding pads;
   (d) bringing a first group of said fuses into a first state and a second group of said fuses different from said first group of said fuses into a second state, the electrical resistance of said fuses in said first state being much greater than that of those in said second state, the difference between said electrical resistances being provided by said part of each of said fuses not covered by said first passivation film; and (e) forming a second passivation film over said semiconductor substrate so as to cover said part of each of said fuses not covered by said first passivation film.

14. The method of manufacturing a semiconductor device as defined in claim 13, wherein said elements include MIS devices, each of said MIS devices consisting of an electrode formed on said semiconductor substrate with an insulating film interposed therebetween, said fuses and said electrodes being made of the same material.

15. The method of manufacturing a semiconductor device as defined in claim 14, wherein said an electrode and said fuses are made of polysilicon.

16. The method of manufacturing a semiconductor device as defined in claim 15, wherein said MIS devices includes MIS capacitors.

17. The method of manfacturing a semiconductor device as defined in claim 13, wherein each of said bonding pads is formed as an integral member.

18. The method of manfacturing a semiconductor device as defined in claim 13, wherein each of said bonding pads are formed of first and second portions formed independently of each other, said first and second portions being electrically connected to each other by said wiring.

19. The method of manufacturing a semiconductor device as defined in claim 13, wherein a portion of each of said bonding pads includes cracks, and wherein the step of forming the second passivation film includes covering said cracks by said second passivation layer.

20. The method of manufacturing a semiconductor device as defined in claim 13, wherein said step (d) comprises the following sub-steps:

(f) bringing a probe for testing for the presence of defective elements into contact with said portions of said part of said bonding pads not covered by the first passivation film;

(g) conducting said test; and (h) bringing said fuses into said first or second state on the basis of the results of said test.

21. The method of manufacturing a semiconductor device as defined in claim 13, which further comprises the following steps:

(i) forming an inter-layer insulating film over said semiconductor substrate so as to cover said fuses and said elements, after said step (a) and before said step (b); and (j) removing at least part of said inter-layer insulating film over each of said fuses.

22. The method of manufacturing a semiconductor device as defined in claim 21, wherein the part of each of said fuses not covered by said inter-layer insulating film is wider than the part of each of said fuses not covered by said first passivation film.

23. The method of manufacturing a semiconductor device as defined in claim 22, wherein contact holes for connecting said elements to said wiring are formed by removing said inter-layer insulating film in said step (j).

24. The method of manfacturing a semiconductor device as defined in claim 13, wherein said second passivation film leaves exposed a portion of each of said bonding pads.

25. Th method of manufacturing a semiconductor device as defined in claim 13, wherein the first passivation film is a passivation film formed by chemical vapor deposition.

26. The method of manufacturing a semiconductor device as defined in claim 25, wherein the second passivation film is formed by chemical vapor deposition.

27. The method of manufacturing a semiconductor device as defined in claim 26, wherein said elements include MISFETs, said MISFETs each have a gate electrode, and wherein the gate electrodes of the MISFETs comprise a layer of polycrystalline silicon having a silicide layer thereon.

28. The method of manufacturing a semiconductor device as defined in claim 27, wherein said silicide layer is a layer of a silicide of a metal with a high melting point.

29. The method of manufacturing a semiconductor device as defined in claim 28, wherein said metal with a high melting point is selected from the group consisting of Mo, W, Ti and Ta.

30. The method of manufacturing a semiconductor device as defined in claim 28, wherein the elements further include capacitors, with each capacitor including a polycrystalline silicon electrode layer formed over the semiconductor substrate.

31. The method of manufacturing a semiconductor device as defined in claim 13, wherein said elements include MISFETs, said MISFETs each have a gate electrode, and wherein the gate electrodes of the MISFETs comprise a layer of polycrystalline silicon having a silicide layer thereon.

32. The method of manufacturing a semiconductor device as defined in claim 31, wherein the elements further include capacitors, with each capacitor including a polycrystalline silicon electrode layer formed on the semiconductor substrate.

33. The method of manufacturing a semiconductor device as defined in claim 13, wherein said elements include electrodes formed on the semiconductor substrate, the electrodes and fuses being formed from the same layer of conductive material.

34. The method of manufacturing a semiconductor device as defined in claim 33, wherein said electrodes are electrodes of MIS elements.

35. The method of manufacturing a semiconductor device as defined in claim 34, wherein said electrodes are electrodes of capacitors.

36. The method of manufacturing a semiconductor device as defined in claim 35, wherein said same layer of conductive material is made of polycrystalline silicon.

37. A method of manufacturing a semiconductor device provided with MISFETs and capacitors, comprising:

(a) forming fuses and said capacitors on a semiconductor substrate, each of said capacitors consisting of electrodes formed on said semiconductor substrate with an insulating film interposed therebetween, said fuses being made of the same material as that of said electrodes;

(b) forming said MISFETs on said semiconductor substrate, each of said MISFETs having a gate electrode formed on said semiconductor substrate with an insulating film interposed therebetween;

(c) forming an inter-layer insulating film covering said fuses, said capacitors and said MISFETs, on said semiconductor substrate;

(d) forming wiring and contact holes for connecting said capacitors to said MISFETs;

(e) forming bonding pads and wirings on said inter-layer insulating film;

(f) forming a first passivation film over said semiconductor substrate except for at least part of each of said fuses and a part of each of said bonding pads;

(g) bringing a first group of said fuses into a first state and a second group of said fuses different from said first group of said fuses into a second state, the electrical resistance of said fuses in said first state being much greater than that of said fuses in said second state, the difference between said electrical resistances being provided by part of each of said fuses not covered by said first passivation film; and (h) forming a second passivation film over said semiconductor substrate so as to cover said part of each of said fuses not covered by said first passivation film.

38. The method of producing a semiconductor device as defined in claim 37, wherein said step (b) of forming said MISFETs includes a sub-step of forming a conductor layer on at least portions of each of said fuses, and wherein said inter-layer insulating layer is formed to expose at least portions of said conductor layer on each of said fuses, and comprises the step of:

(i) removing the portions of said conductor layer on the fuses not covered by said inter-layer insulating film, after said step (e), said conductor layer being of the same material as that of said gate electrodes.

39. The method of producing a semiconductor device as defined in claim 38, wherein said conductor layer is formed on at least portions of each of said fuses, and also on said semiconductor substrate with an insulating film interposed therebetween to form said gate electrode of each of said MISFETs.

40. The method of producing a semiconductor device as defined in claim 38, wherein said conductor layer comprises a first film of polysilicon covered with a second film of a silicide of a metal with a high melting point.

41. The method of manufacturing a semiconductor device as defined in claim 37, wherein said gate electrode of each of the MISFETs comprises a polycrystalline silicon layer having a layer of a silicide thereon.

42. The method of manufacturing a semiconductor device as defined in claim 41, wherein said silicide is a silicide of a metal with a high melting point.

43. The method of manufacturing a semiconductor device as defined in claim 42, wherein said electrodes, of said capacitors, formed on said semiconductor substrate are comprised of polycrystalline silicon.

44. The method of manufacturing a semiconductor device as defined in claim 27, wherein said electrodes, of said capacitors, formed on said semiconductor substrate are comprised of polycrystalline silicon.

45. The method of manufacturing a semiconductor device as defined in claim 37, wherein said semiconductor device is a dynamic random access memory.

46. The method of manufacturing a semiconductor device as defined in claim 1, wherein said semiconductor substrate also has semiconductor elements thereon, the semiconductor elements including electrodes of the same layer of conductive material as said plurality of fuses, with said first passivation film being formed over the electrodes.

47. A method of producing a semiconductor device, comprising the steps of:

(a) forming a thick insulating film over a main surface of a semiconductor substrate so as to divide said main surface into a plurality of regions in which elements will be formed;

(b) forming elements mainly located in said plurality of regions separated by said thick insulating film;

(c) forming fuses on said thick insulating film;

(d) forming bonding pads over the main surface of the semiconductor substrate;

(e) forming a first passivation film so as to cover said semiconductor substrate except for at least part of each of said fuses and except for at least part of the bonding pads formed over the main surface of the semiconductor substrate;

(f) bringing a first group of said fuses into a first state and a second group of said fuses different from said first group of said fuses into a second state, the electrical resistance of said first group of said fuses being much greater than that of said fuses in said second state; and (g) forming a second passivation film covering at least said part of each of said fuses not covered by said first passivation film.

48. The method of manufacturing a semiconductor device as defined in claim 47, wherein said second passivation film leaves exposed a portion of each of said bonding pads.

* * * * *